(12) United States Patent
Keith et al.

(10) Patent No.: US 10,288,775 B1
(45) Date of Patent: May 14, 2019

(54) MULTI-INDEXED PRINTED OPTICS DESIGNS

(71) Applicant: Rockwell Collins, Inc., Cedar Rapids, IA (US)

(72) Inventors: Christopher Alan Keith, Wilsonville, OR (US); Bobby D. Foote, Marion, IA (US); Steven E. Koenck, Cedar Rapids, IA (US); Arvid Christopher Berg, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 90 days.

(21) Appl. No.: 15/140,676

(22) Filed: Apr. 28, 2016

(51) Int. Cl.
*G02B 3/00* (2006.01)
*G02B 5/18* (2006.01)
(Continued)

(52) U.S. Cl.
CPC ............ *G02B 3/0087* (2013.01); *F21K 9/135* (2013.01); *F21K 9/50* (2013.01); *F21V 5/048* (2013.01); *G02B 1/11* (2013.01); *G02B 3/02* (2013.01); *G02B 3/10* (2013.01); *G02B 5/1814* (2013.01); *G02B 5/1847* (2013.01); *H01L 25/0753* (2013.01); *H01L 31/0203* (2013.01); *H01L 31/0216* (2013.01); *H01L 31/02327* (2013.01); *H01L 33/44* (2013.01); *H01L 33/483* (2013.01); *H01L 33/58* (2013.01); *B33Y 10/00* (2014.12);
(Continued)

(58) Field of Classification Search
CPC ............... H01L 33/483; H01L 31/0203; H01L 31/0216; H01L 31/02327; H01L 33/44; H01L 33/58; H01L 25/0753; H01L 2933/0058; G02B 3/10; G02B 1/11; G02B 3/02; G02B 5/1847; G02B 5/1814; G02B 3/0087; F21V 5/048; B33Y 80/00; B33Y 10/00
See application file for complete search history.

(56) References Cited

U.S. PATENT DOCUMENTS 8,472,118 B2 6/2013 Guigan et al.
2009/0180186 A1* 7/2009 Ando ................... B29C 39/025
359/566

(Continued)

FOREIGN PATENT DOCUMENTS

WO 2013167415 A1 11/2013
WO 2014108364 A1 7/2014
WO 2015092015 A1 6/2015

*Primary Examiner* — Kevin Quarterman
(74) *Attorney, Agent, or Firm* — Angel N. Gerdzhikov; Donna P. Suchy; Daniel M. Barbieri

(57) ABSTRACT

Multiple index optical structures, including doublet and triplet lenses, aspheres, torics, atorics, and other types of freeform multiple-index lenses, may be 3D printed as single components from a variety of optical materials having different indices of refraction. 3D-printed Multiple-index lenses may be printed onto other lenses, optical structures, or light emitting structures, or onto components of an electrical optical system to provide color correction and reduced distortions while reducing system complexity by requiring fewer lenses and reducing production costs by reducing the processing power and memory required to maintain system latency. A related method modifies the radiation pattern of an LED assembly by 3D printing optical material directly onto an LED die or an LED emitter bulb.

17 Claims, 7 Drawing Sheets

(51) Int. Cl.

| | |
|---|---|
| *G02B 3/02* | (2006.01) |
| *G02B 1/11* | (2015.01) |
| *G02B 3/10* | (2006.01) |
| *F21K 99/00* | (2016.01) |
| *F21V 5/04* | (2006.01) |
| *H01L 33/58* | (2010.01) |
| *H01L 33/44* | (2010.01) |
| *H01L 31/0232* | (2014.01) |
| *H01L 31/0216* | (2014.01) |
| *H01L 31/0203* | (2014.01) |
| *H01L 33/48* | (2010.01) |
| *H01L 25/075* | (2006.01) |
| *F21Y 101/02* | (2006.01) |
| *B33Y 10/00* | (2015.01) |
| *B33Y 80/00* | (2015.01) |

(52) U.S. Cl.
CPC ........... *B33Y 80/00* (2014.12); *F21Y 2101/02* (2013.01); *H01L 2933/0058* (2013.01)

(56) References Cited

U.S. PATENT DOCUMENTS

| | | |
|---|---|---|
| 2011/0298877 A1 | 12/2011 | Blessing |
| 2012/0019936 A1 | 1/2012 | Blessing et al. |
| 2013/0193592 A1* | 8/2013 | Peil ........................... F21K 9/00 257/791 |
| 2015/0021628 A1 | 1/2015 | Medendorp, Jr. et al. |
| 2015/0061166 A1 | 3/2015 | Van De Vrie et al. |
| 2015/0343673 A1 | 12/2015 | Williams |
| 2018/0087893 A1* | 3/2018 | Sasaki .................. A61B 5/0066 |

* cited by examiner

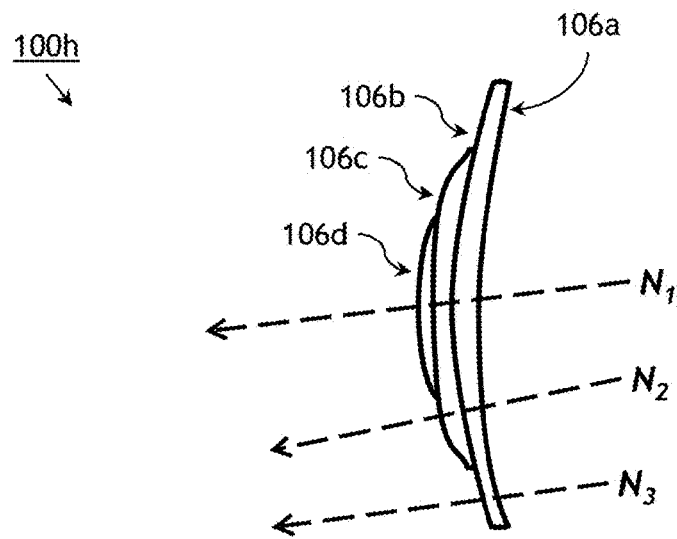
*FIG. 5A*
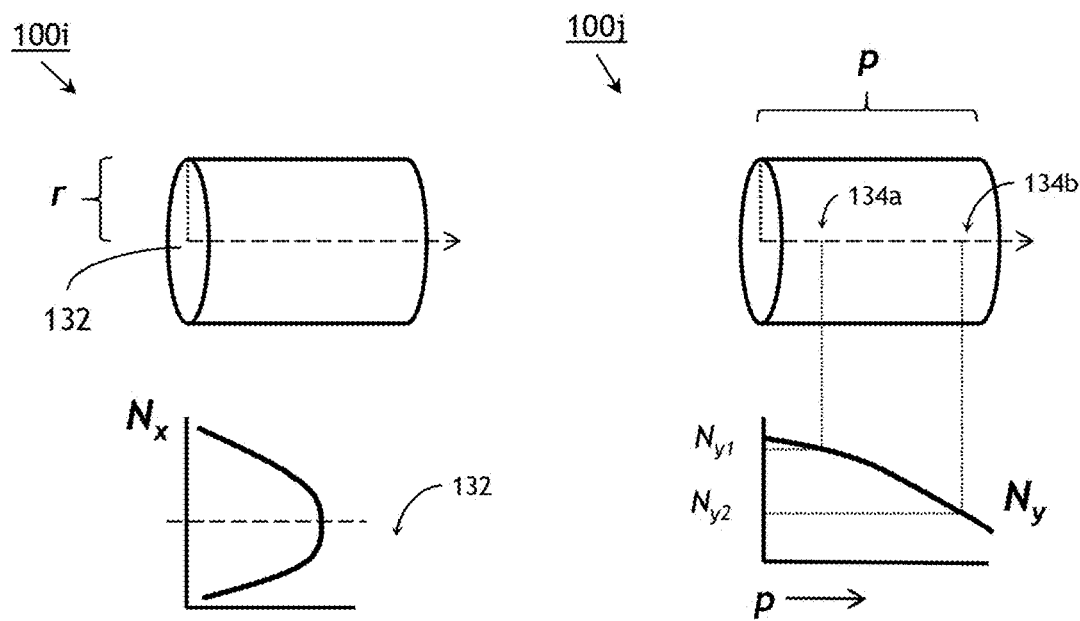
*FIG. 5B*                *FIG. 5C*

200

202 — 3D printing at least one layer of optical material directly onto at least one LED die of an LED assembly

210

212 — 3D printing at least one layer of optical material directly onto the surface of at least one LED emitter bulb of an LED assembly

MULTI-INDEXED PRINTED OPTICS DESIGNS

BACKGROUND

Helmet and head mounted displays (HMD), heads-up displays (HUD), head down displays (HDD), projection systems, illumination sources, sensors, objective lenses, camera lenses, and eyepieces can require complicated optics. These systems may require color correction, distortion correction and usually need to be minimal weight and low cost. Increasing the design options for the optics can result in a reduction in the number of lenses with the benefit of reducing weight and cost.

The display electronics and processors for complex optical systems may need to provide some corrections of images. The significant processing and memory resources required increases system latency, complicating the ability of, e.g., an HMD to display corrected images in real time. Corrections can be achieved by the use of doublets, triplets, or other complex lenses incorporating multiple indices of refraction. However, these complex lenses must be assembled from individual component lenses and bonded together, adding cost and complexity to the manufacturing process. Prototyping of complex optical systems can be costly and time consuming. A fast design approach that yields complex optics quickly with the quality that could be transitioned into production can reduce design time and cost.

SUMMARY

In one aspect, embodiments of the inventive concepts disclosed herein are directed to a multiple-index 3D-printed optical structure. The optical structure may include a lens printed as a single component from one or more optical inks or substantially transparent materials. The lens may include a first layer formed by depositing a first optical material having a first refractive index. The lens may include one or more additional layers formed by depositing additional optical materials (which may have one or more additional refractive indices) directly onto the first layer or onto one or more successive layers.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings:

FIG. 5A illustrates an exemplary embodiment of a multiple-index 3D-printed multifocal optical structure according to the inventive concepts disclosed herein;

FIG. 5B illustrates an exemplary embodiment of a 3D-printed radial gradient-index (GRIN) optical structure according to the inventive concepts disclosed herein;

FIG. 5C illustrates an exemplary embodiment of a 3D-printed axial GRIN optical structure according to the inventive concepts disclosed herein.

DETAILED DESCRIPTION OF EXEMPLARY EMBODIMENTS

Figure 1A:
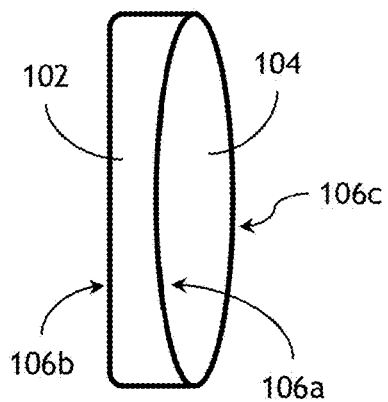
FIG. 1A illustrates an exemplary embodiment of a multiple-index 3D-printed optical structure according to the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a' and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to multiple-index lenses and optical structures assembled monolithically, or 3D-printed as a single component (e.g., a single lens, a single optical assembly) from optical materials having different indices of refraction. Color correction and elimination of off-axis distortion via two-sided optics may be achieved by custom-designing and 3D-printing the required lenses and structures at a lower cost than assembling and bonding optical structures from specially designed and specially fabricated component lenses. Printed multiple-index lenses may be incorporated in an electrical optical system having reduced weight, cost, and complexity, due to the reduction in processing power and memory required for correcting optical distortion.

Referring to FIG. 1A, an exemplary embodiment of a 3D-printed multiple-index lens 100 according to the inventive concepts disclosed herein may include a first layer 102 and a second layer 104. The multiple-index lens 100 may include any optical structure formed as a single component via three-dimensional printing, e.g., by the application of one or more optical inks, adhesives or similar optical materials. The optical materials from which a multiple-index lens 100 may be fashioned may be characterized by substantial transparency and a consistent index of refraction. For example, the first layer 102 may be printed or deposited from an optical material having a refractive index $N_1$, and the second layer 104 may be fashioned from an optical material having a refractive index $N_2$ deposited directly onto the first layer 102. As the second layer 104 is printed directly onto the first layer 102, the multiple-index lens 100 may display the color correction properties of an achromatic doublet-type lens without the need for oiling, air-spacing, cementing, or otherwise combining two component lenses, as the first layer 102 and the second layer 104 are printed as a single lens. For example, the first layer 102 may include a front surface 106a and a rear surface 106b. As the first layer 102 and second layer 104 are formed via continuous 3D printing rather than from two single-index lenses (e.g., a crown glass lens and a flint glass lens) bonded together, the front surface 106a and the rear surface 106b of the first layer 102 may be aspheric, atoric, or free-form surfaces. Similarly, the front surface 106a may become an intermediate surface of the multiple-index lens 100 as the second layer 104 is deposited on the front surface 106a. The second layer 104 may instead be deposited on the rear surface 106b. The front surface 106c of the second layer 104, which may also be aspheric or free-form depending on design considerations, may become a front surface of the multiple-index lens 100.

Figure 1B:
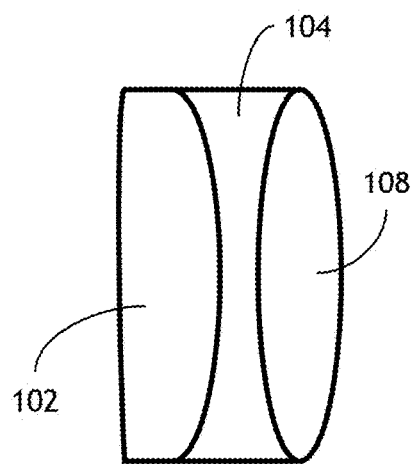
FIG. 1B illustrates an exemplary embodiment of a multiple-index 3D-printed optical structure according to the inventive concepts disclosed herein.

Referring to FIG. 1B, an exemplary embodiment of a 3D-printed multiple-index lens 100a according to the inventive concepts disclosed herein may be implemented similarly to the multiple-index lens 100 of FIG. 1A, except that the multiple-index lens 100a may include a third layer 108. For example, the multiple-index lens 100a may be an apochromatic triplet lens capable of focusing light of three different wavelengths (e.g., red, green, and blue) in a common focal plane. Similarly to the multiple-index lens 100 of FIG. 1A, the multiple-index lens 100a may be printed by depositing a first layer 102 of an optical material having a refractive index $N_1$ and depositing a second layer 104 of an optical material having a refractive index $N_2$. A third layer 108 of optical material having a refractive index $N_3$ may be deposited directly on the second layer 104 to form the multiple-index lens 100a.

Figure 1C:
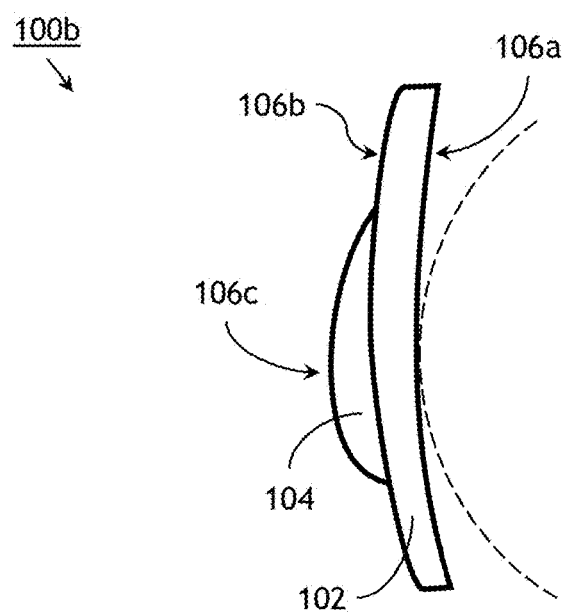
FIG. 1C illustrates an exemplary embodiment of a multiple-index 3D-printed optical structure according to the inventive concepts disclosed herein.

Referring to FIG. 1C, an exemplary embodiment of a 3D-printed multiple-index lens 100b according to the inventive concepts disclosed herein may be implemented similarly to the multiple-index lens 100 of FIG. 1A, except that the one or more of the rear surface 106a, the front surface (intermediate surface) 106b, and the front surface 106c of the multiple-index lens 100b may be aspheric surfaces. For example, the first layer 102 may have aspheric rear and front surfaces 106a-b, which aspheric front surface 106b may become an intermediate surface of the multiple-index lens 100b as the second layer 104 is deposited on the aspheric front surface 106b, resulting in the aspheric front surface 106c of the second layer 104 becoming a front surface of the multiple-index lens 100b.

Figure 1D:
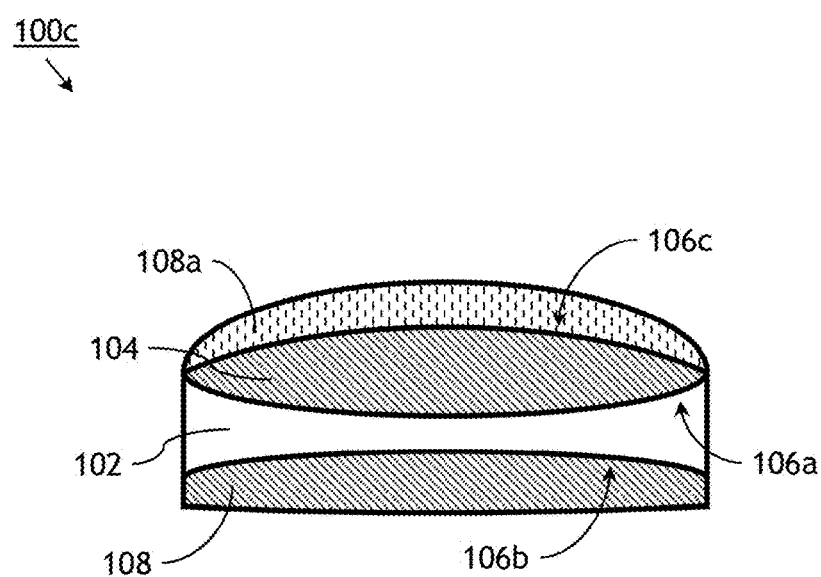
FIG. 1D illustrates an exemplary embodiment of a multiple-index 3D-printed optical structure according to the inventive concepts disclosed herein.
Figure 1E:
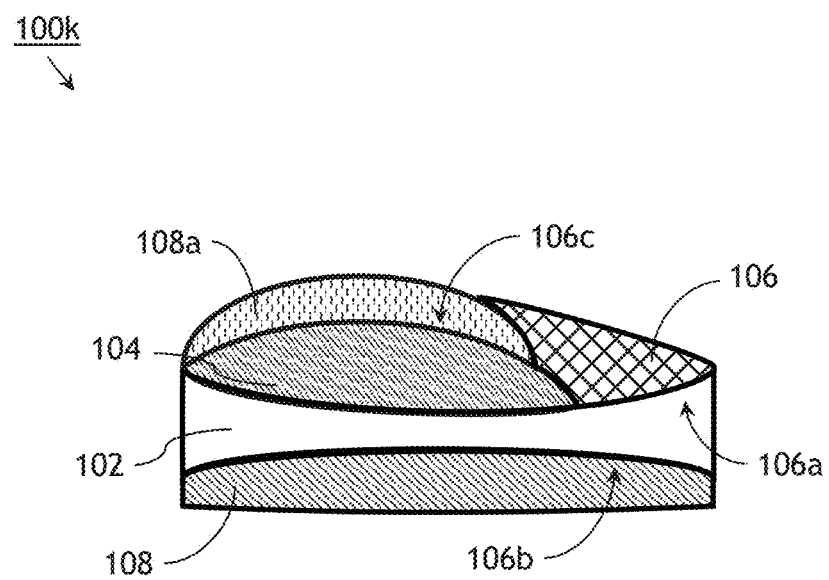
FIG. 1E illustrates an exemplary embodiment of a multiple-index 3D-printed optical structure according to the inventive concepts disclosed herein.

Referring to FIG. 1D, an exemplary embodiment of a 3D-printed multiple-index lens 100c may be implemented similarly to the multiple-index lens 100a of FIG. 1B, except that the multiple-index lens 100c may include both additional second and third layers 104, 108, 108a and one or more layers (104, 108) fashioned of the same optical material or having the same refractive index. For example, the multiple-index lens 100c may be fabricated by 3D printing a second layer 104 of optical material having a refractive index $N_2$ onto the front surface 106a of the first layer 102 of optical material having a refractive index $N_1$, and 3D printing a third layer 108 of the optical material having a refractive index $N_2$ onto the rear (e.g., opposite) surface 106b of the first layer 102. Additional layers of optical material may be 3D printed to any exposed surface (or portion thereof) of the multiple-index lens 100c according to design considerations. For example, a fourth layer 108a of optical material having a refractive index $N_3$ may be printed onto the front surface 106c of the second layer 104. Likewise, referring to FIG. 1E, a fifth layer 106 of optical material having a refractive index $N_4$ may be printed onto one or more of the first layer 102 and the second layer 104.

Figure 2A:
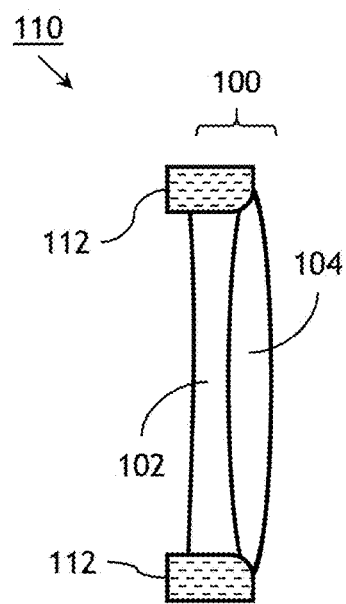
FIG. 2A illustrates an exemplary embodiment of a 3D-printed optical assembly incorporating the multiple-index printed optical structure of FIG. 1A.

Referring to FIG. 2A, an exemplary embodiment of a 3D-printed optical assembly 110 including a multiple-index lens 100 may be implemented similarly to the multiple-index lens 100 of FIG. 1A, except that the optical assembly 110 includes a lens housing 112 on which the first layer 102 or a second layer 104 of the multiple-index lens 100 may be deposited. In some embodiments, the lens housing 112 may be fashioned concurrently with the multiple-index lens 100 by, e.g., printing the lens housing 112 of a suitable printing material (which may or may not have optical properties) as a partial or total perimeter of the multiple-index lens 100.

Figure 2B:
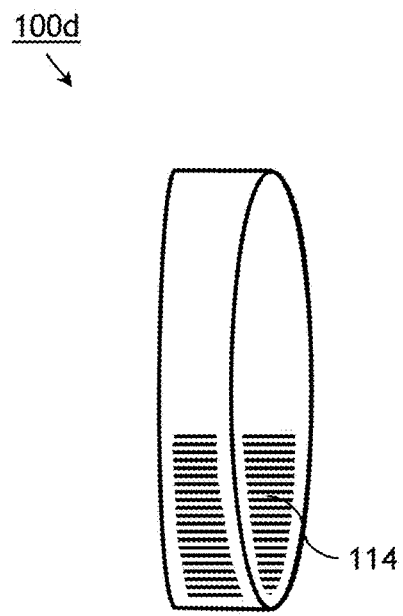
FIG. 2B illustrates an exemplary embodiment of a multiple-index 3D-printed optical structure according to the inventive concepts disclosed herein.

Referring to FIG. 2B, an exemplary embodiment of a 3D-printed multiple-index lens 100d may be implemented similarly to the multiple-index lens 100 of FIG. 1A, except that the multiple-index lens 100d may include a lens dye 114 or other light filtering material incorporated into the multiple-index lens 100d. For example, the lens dye 114 may be 3D printed into portions of the multiple-index lens 100d to manage or filter stray light or to contain light within an optomechanical assembly incorporating the multiple-index lens 100d.

Figure 2C:
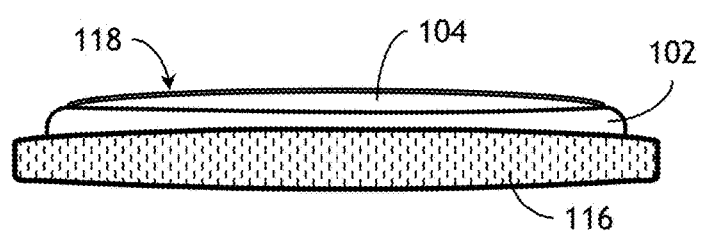
FIG. 2C illustrates an exemplary embodiment of a multiple-index 3D-printed optical structure according to the inventive concepts disclosed herein.

Referring to FIG. 2C, an exemplary embodiment of a 3D-printed multiple-index lens 100e may be implemented similarly to the multiple-index lens 100a of FIG. 1B, except that the multiple-index lens 100e may be fashioned by depositing a first layer 102 (and subsequently one or more second layers 104) onto an existing lens 116 or other optical structure, modifying the refractive properties of the existing lens 116. In addition, the multiple-index lens 100e may include an anti-reflective (AR) coating 118 deposited on the exterior surface 146 of the second layer 104 of the multiple-index lens 100e. The AR coating 118 or any other appropriate lens coating may be 3D printed onto an existing lens 116 or incorporated into the printing of any multiple-index lens 100.

Figure 3A:
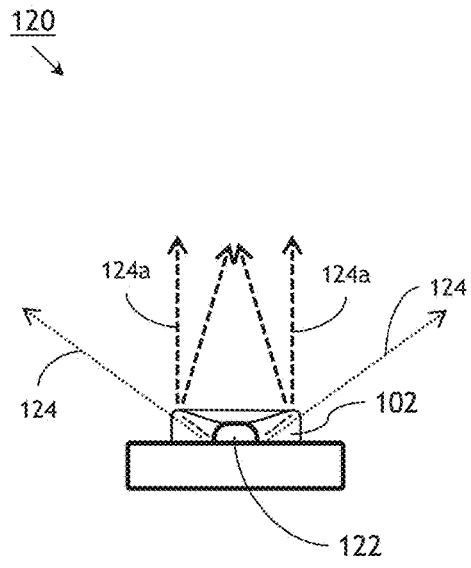
FIG. 3A illustrates an exemplary embodiment of an LED assembly according to the inventive concepts disclosed herein.

Referring to FIG. 3A, an exemplary embodiment of an LED assembly 120 may be implemented similarly to the multiple-index lens 100e of FIG. 2A, except that the LED assembly 120 includes a first layer 102 printed onto an LED die 122 or similar light-emitting optical structure to modify the radiation characteristics of the LED assembly 120. For example, if the light emitted by the LED die 122 has a broad radiation pattern 124, the first layer 102 may be printed directly onto the surface of the LED die 122 to create a more narrowly focused radiation pattern (124a). The LED assembly 120 may include additional second layers 104 printed onto the first layer 102.

Figure 3B:
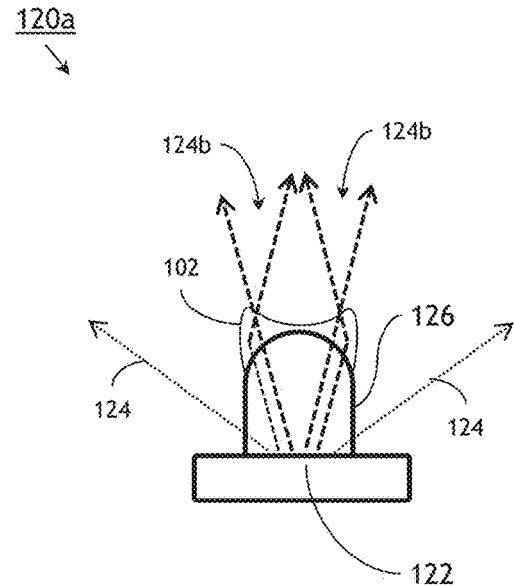
FIG. 3B illustrates an exemplary embodiment of an LED assembly according to the inventive concepts disclosed herein.

Referring to FIG. 3B, an exemplary embodiment of an LED assembly 120a may be implemented similarly to the LED assembly 120 of FIG. 3A, except that the LED assembly 120a may be fashioned by 3D printing the first layer 102 onto an LED lamp 126 (emitter bulb) rather than directly onto the LED die 122, modifying (124b) the broad radiation pattern 124 of the light emitted by the LED assembly 120a.

Figure 4A:
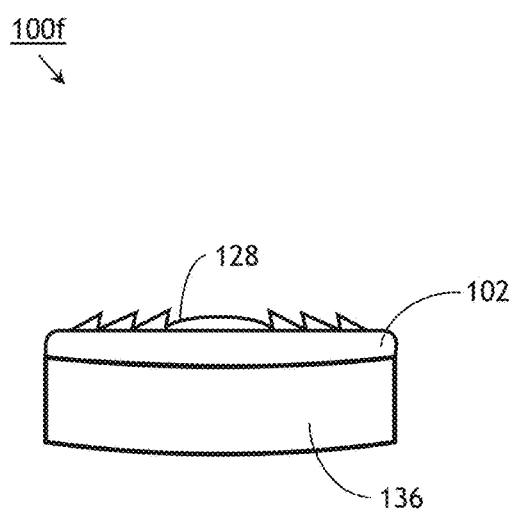
FIG. 4A illustrates an exemplary embodiment of a multiple-index 3D-printed diffracting optical structure according to the inventive concepts disclosed herein.

Referring to FIG. 4A, an exemplary embodiment of a 3D-printed multiple-index lens 100f may be implemented similarly to the multiple-index lens 100 of FIG. 1A, except that the multiple-index lens 100f may be a diffracting lens fashioned by the 3D printing of a diffraction grating 128 onto the first layer 102 of the multiple-index lens 100f. For example, the diffracting multiple-index lens 100f may be 3D printed onto an existing sensor structure 136, the multiple-index lens 100f embodied in a sensor array incorporating one or more sensors configured to detect EM radiation in multiple wavebands (e.g., visible-band, infrared, radar). An incoming waveband may be separated by the diffracting multiple-index lens 100f into, e.g., a first waveband detectable by a first sensor and a second waveband detectable by a second sensor.

Figure 4B:
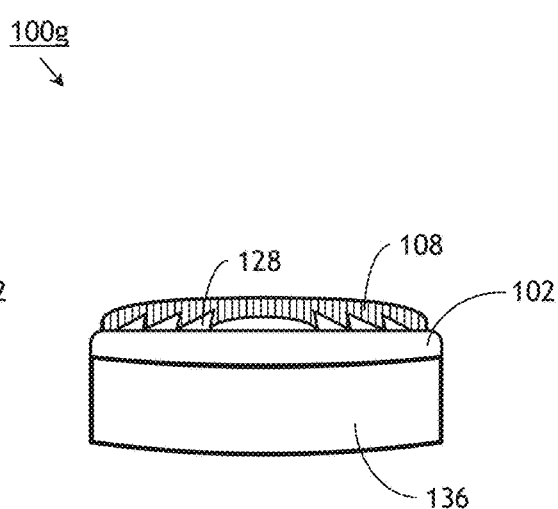
FIG. 4B illustrates an exemplary embodiment of a multiple-index 3D-printed volume grating according to the inventive concepts disclosed herein.

Referring to FIG. 4B, an exemplary embodiment of a 3D-printed multiple-index lens 100g may be implemented similarly to the diffracting multiple-index lens 100f of FIG. 4A, except that the multiple-index lens 100g may be a volume grating. For example, the diffraction grating 128 may be 3D printed from an optical material having a refractive index $N_1$, the diffraction grating 128 filled and capped over by 3D printing a third layer 108 over the diffraction grating 128. In some embodiments, the diffraction grating 128 may be printed from an optical material having a variable refractive index corresponding to an axis of the diffraction grating 128.

Referring to FIG. 5A, an exemplary embodiment of a 3D-printed multiple-index lens 100h may be implemented similarly to the aspheric multiple-index lens 100b of FIG. 1C, except that the multiple-index lens 100h may be a multifocal lens having one or more discrete refractive indices $N_1$, $N_2$, $N_3$ corresponding to different locations on the multiple-index lens 100h (e.g., different combinations of a rear surface 106a and front surfaces 106b, 106c, 106d).

Referring to FIG. 5B, an exemplary embodiment of a 3D-printed multiple-index lens 100i may be implemented similarly to the multiple-index lens 100 of FIG. 1A, except that the multiple-index lens 100i may be a radial gradient-index (GRIN) lens having a variable index of refraction $N_x$. For example, the multiple-index lens 100i may be 3D-printed of an optical material having a higher index of refraction $N_x$ proximate to the core 132 of the multiple-index lens 100i, and decreasing with radial distance r from the core 132.

Referring to FIG. 5C, an exemplary embodiment of a 3D-printed multiple-index lens 100j may be implemented similarly to the radial GRIN lens 100i of FIG. 5A, except that the multiple-index lens 100j may be an axial GRIN lens having a variable index of refraction $N_y$. For example, the multiple-index lens 100j may be 3D printed from a material having an index of refraction $N_y$ that gradually decreases along an optical axis p of the multiple-index lens 100j, such that the indices of refraction $N_y$ at points 134a and 134b along the optical axis p may respectively be $N_{y1}$ and $N_{y2} < N_{y1}$.

Figure 6A:
FIGS. 6A and 6B illustrate exemplary embodiments of a method according to the inventive concepts disclosed herein.

Referring to FIG. 6A, an exemplary embodiment of a method 200 for modifying the radiation pattern of an LED assembly according to the inventive concepts disclosed herein may include the following step. At a step 202, at least one layer of optical material may be 3D printed directly onto the surface of an LED die of an LED assembly to modify the radiation pattern of the light emitted by the LED die.

Figure 6B:

Referring to FIG. 6B, an exemplary embodiment of a method 210 for modifying the radiation pattern of an LED assembly according to the inventive concepts disclosed herein may include the following step. At a step 212, at least one layer of optical material may be 3D printed directly onto the surface of an LED lamp or emitter bulb of an LED assembly to modify the radiation pattern of the light emitted by the LED lamp.

As will be appreciated from the above, systems and methods according to embodiments of the inventive concepts disclosed herein may provide color correction and elimination of off-axis distortion via two-sided optics. By using custom-designed 3D-printed multiple-index printed lenses, such systems can be made lighter and less complex due to the need for fewer lenses and a reduced need for processing power and memory requirements to maintain system latency in electrical optical systems.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

We claim:

1. A multiple-index 3D-printed optical structure, comprising:
   at least one gradient-index (GRIN) lens 3D-printed as a single component from at least one printed material, the at least one lens including:
   a first layer of a first printed material having a first refractive index, the first layer including at least a first surface and a second surface opposite the first surface; and
   at least one second layer formed by depositing one or more second printed materials having at least one second refractive index on the first layer,
   wherein the at least one GRIN lens comprises a variable index of refraction diminishing with distance from an axis defining a core of the at least one GRIN lens, and diminishing with distance linearly along the axis defining the core.

2. The optical structure of claim 1, further comprising:
   a third layer formed by depositing the one or more second printed materials on the first surface, and
   a fourth layer formed by depositing the one or more second printed materials on the second surface.

3. The optical structure of claim 2, further comprising at least one fifth layer formed by depositing one or more third printed materials having at least one third refractive index on one or more of the first layer and the at least one second layer.

4. The optical structure of claim 1, wherein the first surface and the second surface include at least one aspheric surface.

5. The optical structure of claim 1, wherein the at least one lens includes at least one of an aspheric lens, a toric lens, an atoric lens, and a free form lens.

6. The optical structure of claim 1, wherein the optical structure is a first optical structure, and the first layer is formed by depositing the first printed material on a second optical structure.

7. The optical structure of claim 6, wherein the second optical structure includes at least one second lens.

8. The optical structure of claim 6, wherein the second optical structure includes at least one of an LED lamp and an LED die.

9. The optical structure of claim 6, wherein the second optical structure includes a sensor structure.

10. The optical structure of claim 1, wherein one or more of the first layer and the at least one second layer includes a printed anti-reflective coating.

11. The optical structure of claim 1, further comprising:
    at least one housing configured to cover a portion of the at least one lens, the at least one housing formed by depositing one or more fourth printed materials on one or more of the first layer and the at least one second layer.

12. The optical structure of claim 1, wherein the at least one printed material includes at least one of a lens dye and a light filtering compound.

13. The optical structure of claim 1, wherein at least one of the first layer and the at least one second layer includes a diffraction grating.

14. The optical structure of claim 13, wherein one or more of the first refractive index and the at least one second refractive index is a first variable refractive index corresponding to a first axis of the at least one diffraction grating.

15. The optical structure of claim 13, wherein:
    the at least one diffraction grating is a volume grating formed by depositing the at least one second layer on the at least one diffraction grating;
    the at least one diffraction grating has a fourth refractive index not equal to the at least one second refractive index.

16. The optical structure of claim 1, wherein the at least one lens is a multifocal lens associated with one or more focal points and having at least one third surface including a plurality of locations, the multifocal lens having one or more fifth refractive indices, each fifth refractive index associated with at least one location of the plurality of locations.

17. The optical structure of claim 1, wherein the at least one GRIN lens includes one or more of:
    a radial GRIN lens having a center, the at least one second variable refractive index corresponding to a radial distance from the center; and
    an axial GRIN lens having at least one second axis including a plurality of axis points, the at least one second variable refractive index corresponding to the plurality of axis points.

* * * * *